(12) United States Patent
Xue et al.

(10) Patent No.: US 12,477,666 B2
(45) Date of Patent: Nov. 18, 2025

(54) ARRANGEMENT OF TWO SECONDARY CIRCUIT BOARDS WITHIN AN ELECTRONIC DEVICE

(71) Applicant: Honor Device Co., Ltd., Shenzhen (CN)

(72) Inventors: Kangle Xue, Shenzhen (CN); Jiuliang Gao, Shenzhen (CN); Lijun Yang, Shenzhen (CN); Baojun Gao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/002,199

(22) PCT Filed: Aug. 19, 2022

(86) PCT No.: PCT/CN2022/113649
§ 371 (c)(1),
(2) Date: Dec. 16, 2022

(87) PCT Pub. No.: WO2023/103450
PCT Pub. Date: Jun. 15, 2023

(65) Prior Publication Data
US 2024/0237235 A1    Jul. 11, 2024

(30) Foreign Application Priority Data

Dec. 8, 2021   (CN) .................. 202123069685.X
Dec. 21, 2021  (CN) .................. 202123228824.9

(51) Int. Cl.
*H05K 13/00*    (2006.01)
*H01R 12/52*    (2011.01)
(Continued)

(52) U.S. Cl.
CPC ............ *H05K 5/003* (2013.01); *H01R 12/52* (2013.01); *H05K 1/0277* (2013.01);
(Continued)

(58) Field of Classification Search
CPC .............................. H05K 1/189; H04M 1/026
See application file for complete search history.

(56) References Cited

U.S. PATENT DOCUMENTS 7,931,476 B2 *  4/2011  Russell .............. H01R 13/2414
                                                439/91
8,089,774 B2 *  1/2012  Choi ....................... G11C 5/04
                                               174/254
(Continued)

FOREIGN PATENT DOCUMENTS

CN        1694601 A      11/2005
CN      106132087 A      11/2016
(Continued)

*Primary Examiner* — Vanessa Girardi
(74) *Attorney, Agent, or Firm* — Slater Matsil, LLP (57) ABSTRACT

An electronic assembly includes a first electronic component, a second electronic component, and a primary circuit board. The first electronic component is provided with a first secondary circuit board, the second electronic component is provided with a second secondary circuit board, the first secondary circuit board is electrically connected to the primary circuit board by using a first electrical connector, interlayer space is formed between the first secondary circuit board and the primary circuit board, a portion of the second secondary circuit board that enters the interlayer space overlaps the first secondary circuit board and is electrically connected to the primary circuit board by using a second electrical connector, the first electrical connector is located between the first secondary circuit board and the primary circuit board, and the second electrical connector is located between the second secondary circuit board and the primary circuit board.

20 Claims, 5 Drawing Sheets

(51) Int. Cl.
*H05K 1/02* (2006.01)
*H05K 5/00* (2006.01)

(52) U.S. Cl.
CPC ....... *H05K 5/0065* (2013.01); *H05K 13/0015* (2013.01); *H05K 2201/10083* (2013.01); *H05K 2201/1009* (2013.01); *H05K 2201/10121* (2013.01); *H05K 2201/10151* (2013.01)

(56) References Cited

U.S. PATENT DOCUMENTS

| | | |
|---|---|---|
| 9,578,759 B2 | 2/2017 | Seo et al. |
| 10,674,607 B2 * | 6/2020 | Park .................... H04M 1/0262 |
| 11,019,736 B2 | 5/2021 | Woo et al. |
| 11,057,507 B2 | 7/2021 | Ren |
| 2006/0211388 A1 | 9/2006 | Lambert et al. |

FOREIGN PATENT DOCUMENTS

| | | |
|---|---|---|
| CN | 109995898 A | 7/2019 |
| CN | 110012599 A | 7/2019 |
| CN | 209710428 U | 11/2019 |
| CN | 113055511 A | 6/2021 |
| CN | 113597093 A | 11/2021 |
| CN | 217217080 U | 8/2022 |

* cited by examiner

ARRANGEMENT OF TWO SECONDARY CIRCUIT BOARDS WITHIN AN ELECTRONIC DEVICE

CROSS-REFERENCE TO RELATED APPLICATIONS

This application is a national stage of International Application No. PCT/CN2022/113649, filed on Aug. 19, 2022, which claims priority to Chinese Patent Application No. 202123069685.X, filed on Dec. 8, 2021, and claims priority to Chinese Patent Application No. 202123228824.9, filed on Dec. 21, 2021. The disclosures of each of the aforementioned applications are hereby incorporated by reference in their entireties.

TECHNICAL FIELD

This application relates to the field of electronic assembly technologies, and in particular, to an electronic assembly of an electronic device. This application further relates to an electronic device provided with the electronic assembly.

BACKGROUND

At present, with the development of technologies and the continuous escalation of consumption demands, electronic devices such as mobile phones and notebook computers are all developing towards miniaturization and a light and thin design. In addition, to achieve more diversified functions, types and quantities of electronic components inside the electronic devices also keep growing. All these factors lead to increasing lack of design space inside the electronic devices.

For example, a mobile phone is usually provided with an optical proximity sensor and an ambient light sensor. The optical proximity sensor is used to determine a status of whether the mobile phone and an object are close to or away from each other. The ambient light sensor is used to sense brightness of surrounding light. The optical proximity sensor and/or the ambient light sensor are/is usually located in an upper half of the mobile phone. The upper half of the mobile phone is often further provided with other electronic components such as a camera, a speaker, and a vibration motor. These electronic components may be electrically connected to a primary circuit board in a manner of staggered layout if internal space permits.

However, when the internal space is insufficient, for example, when another electronic component such as a camera, a speaker, or a vibration motor has an increased volume due to a performance requirement, an overall stacking density increases, which further increases difficulty in electrical layout and connection.

SUMMARY

Embodiments of this application provide an electronic assembly that enables more effective use of overall space for electrical layout and connection.

An embodiment of this application provides an electronic assembly. The electronic assembly mainly includes a first electronic component, a second electronic component, a primary circuit board, and the like. The first electronic component is provided with a first secondary circuit board, the second electronic component is provided with a second secondary circuit board, the first secondary circuit board is connected to the primary circuit board by using a first electrical connector, interlayer space capable of accommodating the second secondary circuit board is formed between the first secondary circuit board and the primary circuit board after they are connected, a portion of the second secondary circuit board that enters the interlayer space overlaps the first secondary circuit board and is electrically connected to the primary circuit board by using a second electrical connector. In this way, in an overlapping direction, a stacked connection structure having at least three layers of circuit boards is formed, and the three layers of circuit boards are respectively the primary circuit board, the first secondary circuit board, and the second secondary circuit board. The second secondary circuit board is located between the first secondary circuit board and the primary circuit board, the first electrical connector is located between the first secondary circuit board and the primary circuit board, and the second electrical connector is located between the second secondary circuit board and the primary circuit board.

The second secondary circuit board of the electronic assembly provided in this embodiment overlaps the first secondary circuit board thereof. Then, the first secondary circuit board and the second secondary circuit board are connected to the primary circuit board by using the first electrical connector and the second electrical connector, respectively, thereby forming a spatially stacked electrical connection structure. In this way, space in the overlapping direction can be fully used to perform electrical layout and connection. When internal space is limited, the first secondary circuit board and the second secondary circuit board can be connected to the primary circuit board without being staggered from each other. This can implement miniaturization and compactness of the electrical connection structure, provide more effective space for the primary circuit board or other parts, and reduce difficulty in electrical layout and connection.

Optionally, an operating height of the first electrical connector is greater than an operating height of the second electrical connector, so that the second secondary circuit board and the second electrical connector can be located in the interlayer between the primary circuit board and the first secondary circuit board.

Optionally, a difference between an operating height of the first electrical connector and an operating height of the second electrical connector is equal to a distance from one side of the first secondary circuit board that faces the primary circuit board to one side of the second secondary circuit board that faces the primary circuit board.

The settings of the height difference ensure that after the second secondary circuit board overlaps the first secondary circuit board, both the first secondary circuit board and the second secondary circuit board can be effectively electrically connected to the primary circuit board by using the first electrical connector and the second electrical connector, respectively, without incurring problems such as a conduction failure, poor contact, or excessive stress.

Optionally, the second secondary circuit board overlaps a local region of the first secondary circuit board, and a single-layer non-overlapped region and a dual-layer overlapped region are formed after the overlapping of the two secondary circuit boards; and the first electrical connector includes a plurality of first elastomers distributed along an edge of the non-overlapped region, and the second electrical connector includes a plurality of second elastomers distributed along an edge of the overlapped region.

Optionally, an adhesive layer is provided in regions that overlap each other between the second secondary circuit board and the first secondary circuit board.

By applying the adhesive layer between the second secondary circuit board and the first secondary circuit board, in one aspect, the second secondary circuit board can be securely attached to the first secondary circuit board, to prevent the second secondary circuit board from being detached from the first secondary circuit board; and in another aspect, because the adhesive layer has some elasticity, the second secondary circuit board has a specific adjustment margin in the overlapping direction, and also plays a cushioning effect, to avoid hard friction between the second secondary circuit board and the first secondary circuit board.

Optionally, the electronic assembly further includes a positioning mechanism configured to position the first secondary circuit board and the second secondary circuit board.

Disposing the positioning mechanism not only enables the first secondary circuit board and the second secondary circuit board to be effectively positioned to prevent them from deviating from designed locations due to vibration, fall-off, or another cause during use, but also helps stack the first secondary circuit board and the second secondary circuit board, thereby improving assembly efficiency.

Optionally, the positioning mechanism includes at least one positioning column perpendicular to the first secondary circuit board and the second secondary circuit board; and the first secondary circuit board is provided with a first positioning hole or a first positioning groove for the positioning column to pass through, and the second secondary circuit board is provided with a second positioning hole or a second positioning groove for the positioning column to pass through.

Disposing the positioning column can limit degrees of freedom of the first secondary circuit board and the second secondary circuit board in deviating from planes on which the circuit boards are respectively located, so that the first secondary circuit board and the second secondary circuit board are reliably positioned.

Optionally, a cross section of the positioning column is circular or polygonal, and the first positioning hole or the first positioning groove and the second positioning hole or the second positioning groove have a shape capable of fitting in with the positioning column.

Optionally, the positioning mechanism includes a positioning frame configured to bear the first secondary circuit board, and an inner wall of the positioning frame is provided with a positioning rib protruding towards the inside of the positioning frame, to position the first secondary circuit board and the second secondary circuit board.

Optionally, the first secondary circuit board is provided with a first abutting portion, the second secondary circuit board is provided with a second abutting portion, and both the first abutting portion and the second abutting portion abut against the positioning rib.

With coordination between the positioning rib and the first and second abutting portions, the degrees of freedom of the first secondary circuit board and the second secondary circuit board in deviating from the planes on which the circuit boards are respectively located can be limited, so that the first secondary circuit board and the second secondary circuit board are reliably positioned.

Optionally, the first abutting portion includes a first right-angle portion formed on a side wall of the first secondary circuit board, the second abutting portion includes a second right-angle portion formed on a side wall of the second secondary circuit board, the first right-angle portion is disposed opposite to the second right-angle portion, and the first right-angle portion and the second right-angle portion each abut against a side wall of the positioning rib.

Optionally, a glue layer is provided between the first secondary circuit board and a bearing surface of the positioning frame.

Optionally, the second secondary circuit board is a flexible circuit board.

Optionally, a portion in which the second secondary circuit board overlaps the first secondary circuit board is provided with a reinforcing layer, to increase strength of the overlapped portion of the second secondary circuit board.

Optionally, there are a plurality of second electronic components, and each of the second electronic components is provided with the second secondary circuit board.

Optionally, the first electronic component includes an optical proximity sensor, an ambient light sensor, or an optical proximity-ambient light integrated sensor, and the second electronic component includes one, two, or three of a camera, a speaker, and a vibration motor.

An embodiment of this application further provides an electronic device, including a housing and an electronic assembly disposed inside the housing. The electronic assembly includes the electronic assembly according to any one of the foregoing implementations.

The electronic device provided in this embodiment is provided with the electronic assembly. Because the electronic assembly has the foregoing technical effects, the electronic device provided with the electronic assembly should also have the corresponding technical effects.

DESCRIPTION OF REFERENCE NUMERALS

1. housing; 2. screen; 3. vibration motor; 4. optical proximity-ambient light integrated sensor; 5. positioning frame; 6. through hole; 7. primary circuit board; 8. first secondary circuit board; 9. glue layer; 10. first elastomer; 11. interlayer space; 12. notch; 13. second secondary circuit board; 14. second elastomer; 15. adhesive layer; 16. positioning column; 17. positioning hole; 18. positioning groove; 19. positioning rib; 20. first right-angle position; and 21. second right-angle position.

DETAILED DESCRIPTION OF ILLUSTRATIVE EMBODIMENTS

To enable a person skilled in the art to better understand the solutions of this application, the following describes this application in further detail with reference to the accompanying drawings and specific implementations.

In the description of the embodiments of this application, unless other specified, "/" represents a meaning of "or". For example, "A/B" may represent A or B. The term "and/or" in this specification describes only an association relationship for describing associated objects and represents that three relationships can exist. For example, "A and/or B" can represent the following three cases: Only A exists, both A and B exist, and only B exists.

In this specification, the terms such as "upper, lower, inner, and outer" are determined based on a positional relationship shown in the accompanying drawings, and the corresponding positional relationship may vary with different accompanying drawings. Therefore, the positional relationship cannot be construed as an absolute limitation on the protection scope. In addition, relational terms such as "first" and "second" are merely used to distinguish one part from another part with a same name, and do not necessarily require or imply that any such actual relationship or order exists between these parts.

Referring to FIG. 1 to FIG. 5, a provided electronic assembly is described by using a mobile phone as an example in the embodiments. The mobile phone usually includes a housing 1, a screen 2 located on a front face of the housing, a battery provided inside the housing, various electronic components, and the like. Typical electronic components inside the mobile phone include a camera, a speaker, a vibration motor 3, an optical proximity-ambient light integrated sensor 4, and the like. These electronic components may be, for example, all disposed on a circuit board of the mobile phone. The circuit board may be located in an upper half of the mobile phone (for upper and lower directions, refer to FIG. 1 and FIG. 8). Because a quantity of electronic components mounted on the circuit board of the mobile phone is large and a stacking density is large, difficulty in electrical layout and connection is relatively large.

Figure 1:
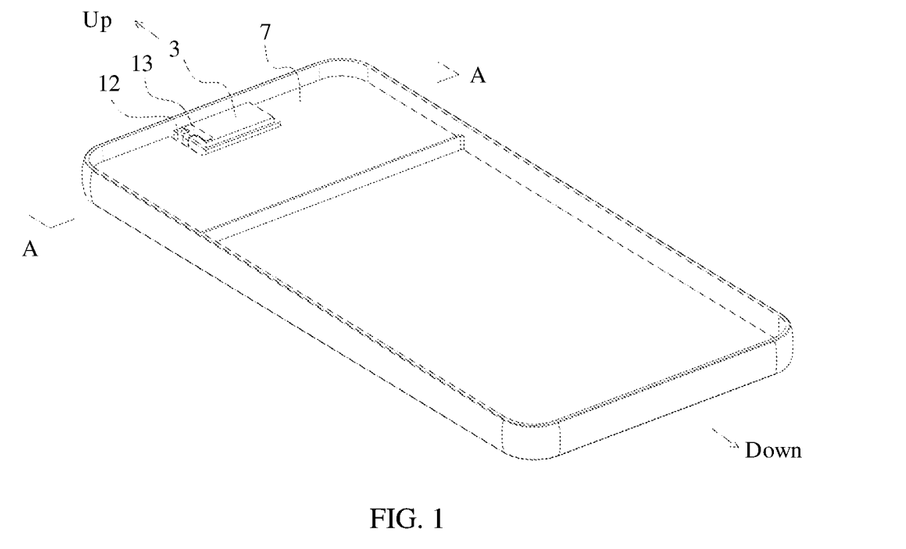
FIG. 1 is a schematic diagram of a structure of an electronic assembly according to an embodiment of this application.

The optical proximity-ambient light integrated sensor 4 is located in a location that is close to an upper edge of the mobile phone and is biased to one side. The optical proximity-ambient light integrated sensor 4 is mounted in a hidden manner behind the screen 2, and can determine a status of whether the mobile phone and an object are close to or away from each other. During call answering or voice chatting over WeChat, the optical proximity-ambient light integrated sensor 4 can perceive that the mobile phone is approaching an ear and outputs a signal to control the screen 2 to be turned off. When the mobile phone is away from the ear, the screen 2 is lit again. Such implementation prevents a face or an ear from hanging up the mobile phone or starting another application by accidentally touching the screen 2, and enables perceiving of a surrounding light status. A processing chip is used to automatically adjust backlight brightness of a display, to reduce power consumption of the product and maximize a battery life. In addition, the optical proximity-ambient light integrated sensor 4 helps the screen 2 provide a soft picture. When ambient brightness is high, the screen 2 can be automatically adjusted to high brightness, and when an ambient environment is dark, the screen 2 can be automatically adjusted to low brightness, thereby implementing automatic brightness adjustment.

The vibration motor 3 is a micro motor and is configured to enable the mobile phone to generate a vibration effect. One side of the vibration motor 3 is provided with a substantially rectangular positioning frame 5, and the optical proximity-ambient light integrated sensor 4 is mounted in the positioning frame 5. A front face of the positioning frame 5 is provided with a through hole 6. The through hole 6 corresponds to an emitter and a receiver of the optical proximity-ambient light integrated sensor 4, so that the optical proximity-ambient light integrated sensor 4 can work normally.

Figure 4:
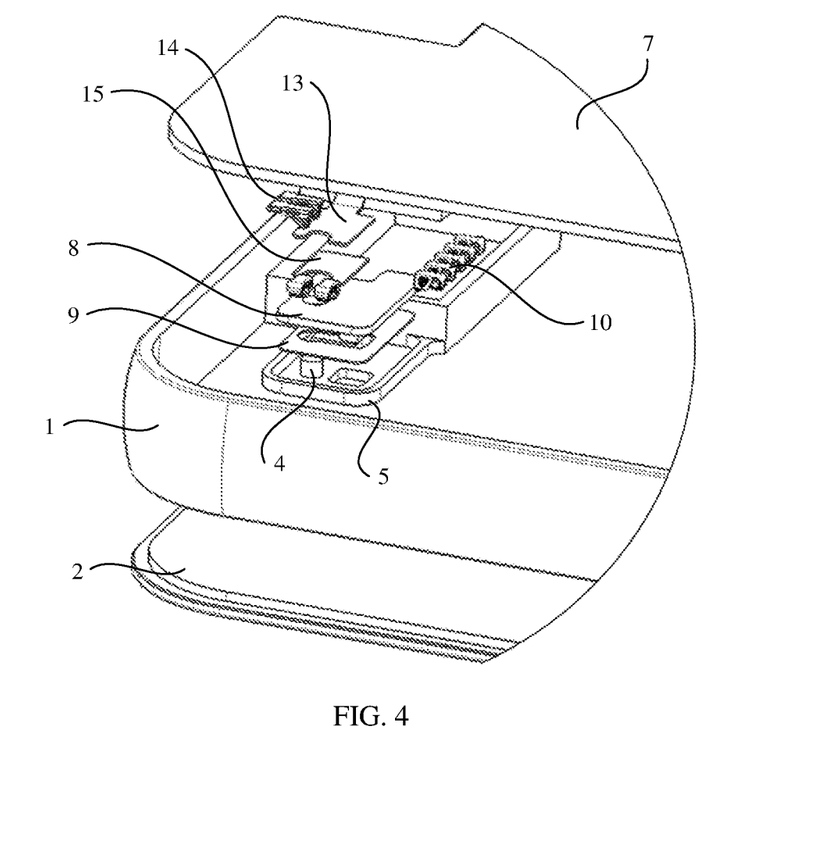
FIG. 4 is a schematic exploded view of the electronic assembly shown in FIG. 1.
Figure 5:
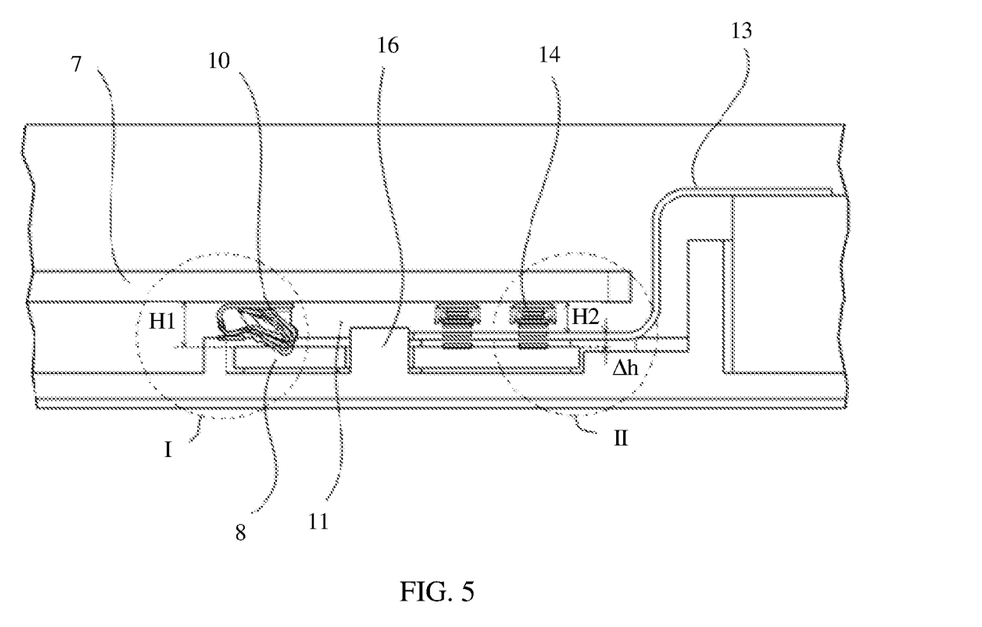
FIG. 5 is a cutaway drawing along A-A in FIG. 1.

A primary circuit board 7 is provided inside the mobile phone, and both the optical proximity-ambient light integrated sensor 4 and the vibration motor 3 need to be electrically connected to the primary circuit board 7, to implement functions such as power conduction, signal transmission, and control. A circuit board of the optical proximity-ambient light integrated sensor 4 is a first secondary circuit board 8. The first secondary circuit board 8 is a rigid circuit board, has a shape similar to that of the positioning frame 5, and can be placed inside the positioning frame 5. A glue layer 9 is applied between the first secondary circuit board 8 and a bearing surface of the positioning frame 5, and the first secondary circuit board 8 can be preliminarily positioned by using the glue layer 9. The primary circuit board 7 is parallel to the first secondary circuit board 8. Several first elastomers 10 are provided on one side of the primary circuit board 7 that corresponds to the first secondary circuit board 8. When the primary circuit board 7 is pressed towards the first secondary circuit board 8, the first elastomers 10 come into contact with conductive portions on the first secondary circuit board 8, thereby implementing an electrical connection. In addition, because the first elastomers 10 have a specific height, under support action of the first elastomers 10, interlayer space 11 is formed between the primary circuit board 7 and the first secondary circuit board 8.

The vibration motor 3 has a specific height. An upper edge of the primary circuit board 7 is provided with a rectangular notch 12 to avoid the vibration motor 3 through the rectangular notch 12. The vibration motor 3 is electrically connected to the primary circuit board 7 by using a second secondary circuit board 13. Because the vibration motor 3 is higher than the primary circuit board 7, the second secondary circuit board 13 is a flexible circuit board. The second secondary circuit board 13 is led out from the vibration motor 3, bent downward by 90 degrees, and then bent horizontally by 90 degrees, and subsequently enters the interlayer space 11 between the primary circuit board 7 and the first secondary circuit board 8. In the interlayer space 11, the second secondary circuit board 13 is electrically connected to the primary circuit board 7 by using a second elastomer 14. A width of a middle portion of the second secondary circuit board 13 is less than widths of two ends thereof. One end of the second secondary circuit board 13 that is connected to the vibration motor 3 is substantially T-shaped, and one end of the second secondary circuit board 13 that enters the interlayer space 11 and is connected to the primary circuit board 7 is substantially rectangular.

The end of the second secondary circuit board 13 that enters the interlayer space 11 overlaps the first secondary circuit board 8, and an adhesive layer 15 is provided in regions that overlap each other between the second secondary circuit board 13 and the first secondary circuit board 8. By applying the adhesive layer 15, the second secondary circuit board 13 can be securely attached to the first secondary circuit board 8, to prevent the second secondary circuit board 13 from being detached from the first secondary circuit board 8; and because the adhesive layer 15 has some elasticity, the second secondary circuit board 13 has a specific adjustment margin in an overlapping direction, and also plays a cushioning effect, to avoid hard friction between the second secondary circuit board 13 and the first secondary circuit board 8.

In addition, a portion in which the second secondary circuit board 13 overlaps the first secondary circuit board 8 is further provided with a reinforcing layer (not shown in the figure), to increase strength of the overlapped portion of the second secondary circuit board 13. The reinforcing layer may be a stainless steel sheet. Certainly, the reinforcing layer is not necessary. In another embodiment, the second secondary circuit board 13 may be not provided with a reinforcing layer.

Figure 8:
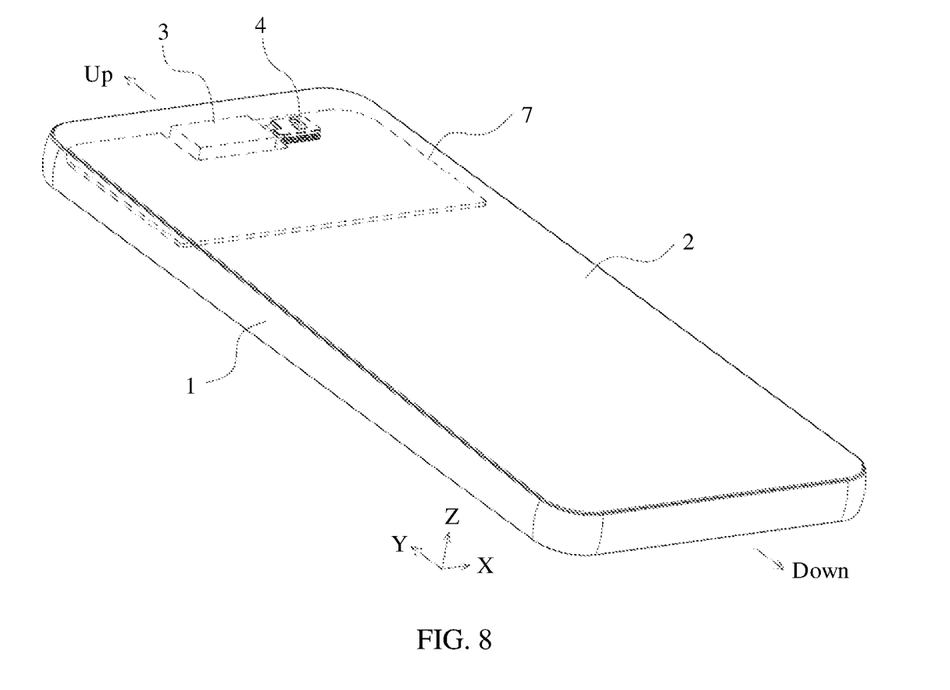
FIG. 8. is a diagram of an axial side of an electronic device according to an embodiment of this application, where the diagram of the axial side is 180 degrees inverted relative to FIG. 1, and a dashed-line part is the electronic assembly shown in FIG. 1.

As shown in FIG. 5, after the optical proximity-ambient light integrated sensor 4 and the vibration motor 3 are connected to the primary circuit board 7 by using the foregoing structure, in the overlapping direction, that is, a Z direction denoted in FIG. 8, a connection structure having three layers of stacked circuit boards is formed, and the three layers of stacked circuit boards are respectively the first secondary circuit board 8, the second secondary circuit board 13, and the primary circuit board 7. The second secondary circuit board 13 is located between the first secondary circuit board 8 and the primary circuit board 7, the first elastomers 10 are located between the first secondary circuit board 8 and the primary circuit board 7, and the second elastomer 14 is located between the second secondary circuit board 13 and the primary circuit board 7.

In this way, space in the overlapping direction can be fully used to perform electrical layout and connection. When internal space is limited, the first secondary circuit board 8 and the second secondary circuit board 13 can be connected to the primary circuit board 7 without being staggered from each other. This can implement miniaturization and compactness of the electrical connection structure, provide more effective space for the primary circuit board 7 or other parts, and reduce difficulty in electrical layout and connection.

Figure 6:
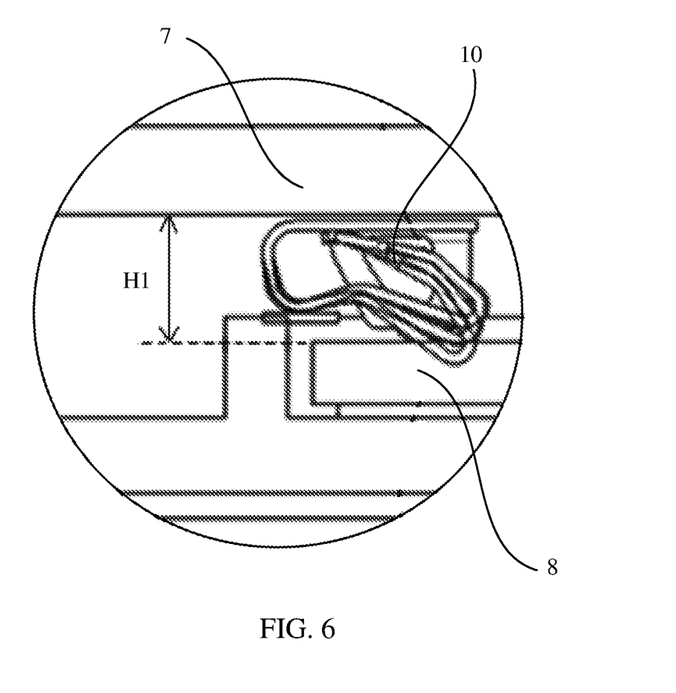
FIG. 6 is a local enlarged view of a part I in FIG. 5.
Figure 7:
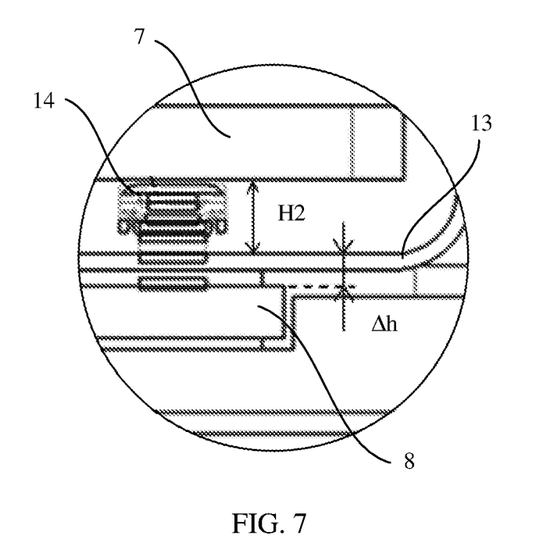
FIG. 7 is a local enlarged view of a part II in FIG. 5.

As shown in FIG. 6 and FIG. 7, the first elastomers 10 and the second elastomer 14 are elastic electrical connectors. Heights, of the first elastomers 10 and the second elastomer 14, obtained after the elastomers are pressed are their respective operating heights. The operating height of the first elastomers 10 is different from the operating height of the second elastomer 14. After assembly is completed, the operating height H1 of the first elastomers 10 is greater than the operating height H2 of the second elastomer 14, and a difference between the operating height H1 of the first elastomers 10 and the operating height H2 of the second elastomer 14 is equal to a distance Δh from one side of the first secondary circuit board 8 that faces the primary circuit board 7 to one side of the second secondary circuit board 13 that faces the primary circuit board 7.

Specifically, if the operating height of the first elastomers 10 is L1 and a total of a thickness of the second secondary circuit board 13, a thickness of the reinforcing layer, and a thickness of the adhesive layer 15 is T, the operating height L2 of the second elastomer 14 is equal to L1 minus T. In other words, the operating height L1 of the first elastomers 10 is equal to the operating height L2 of the second elastomer 14 plus all of the thickness of the second secondary circuit board 13, the thickness of the reinforcing layer, and the thickness of the adhesive layer 15.

With such a height difference specified, in one aspect, the second secondary circuit board 13 and the second elastomer 14 can be located in the interlayer space 11 between the primary circuit board 7 and the first secondary circuit board 8; and in another aspect, it can be ensured that after the second secondary circuit board 13 overlaps the first secondary circuit board 8, both the first secondary circuit board 8 and the second secondary circuit board 13 can be effectively electrically connected to the primary circuit board 7 by using the first elastomers 10 and the second elastomer 14, respectively, without incurring problems such as a conduction failure, poor contact, or excessive stress.

Figure 2:
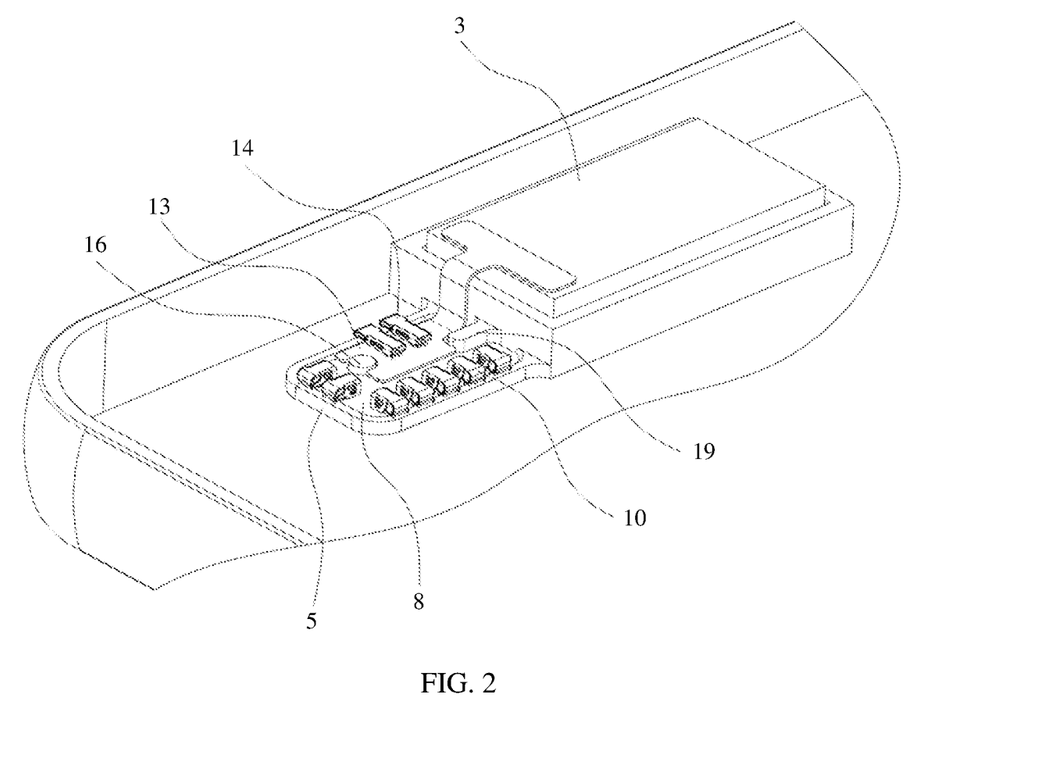
FIG. 2 is a partial schematic diagram of the electronic assembly shown in FIG. 1 from which a primary circuit board is removed.
Figure 3:
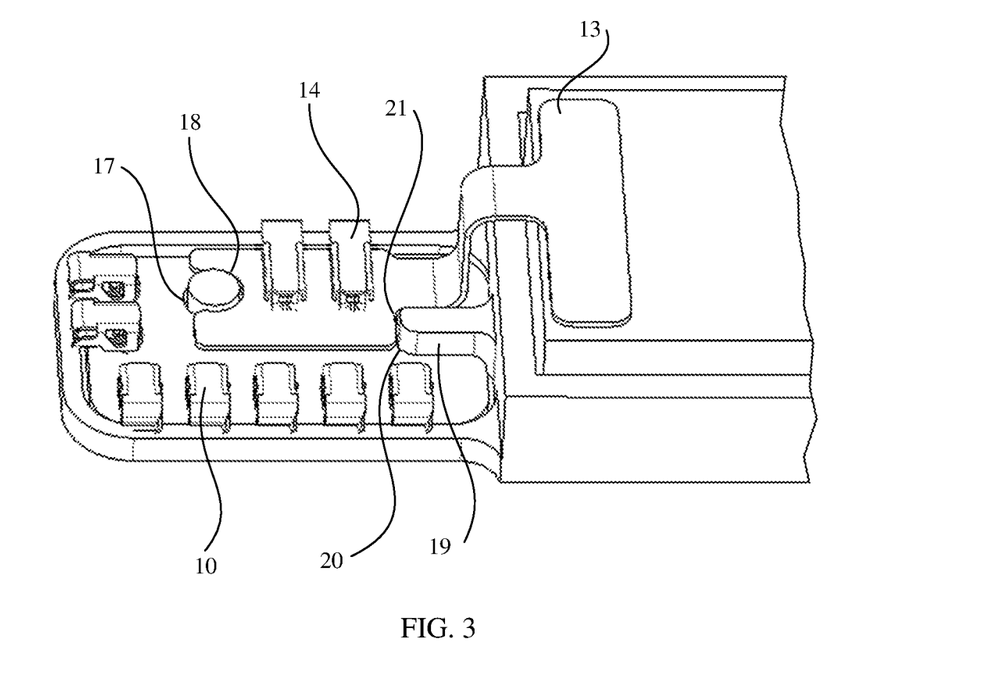
FIG. 3 is a local enlarged view of FIG. 2.

An area of an end at which the second secondary circuit board 13 overlaps the first secondary circuit board 8 is less than that of the first secondary circuit board 8. An upper edge of the second secondary circuit board 13 is flush with an upper edge of the first secondary circuit board 8. After the second secondary circuit board 13 overlaps the first secondary circuit board 8, a single-layer non-overlapped region and a dual-layer overlapped region are formed. The first elastomers 10 are arranged along an edge of the non-overlapped region, and the second elastomer 14 is arranged along an edge of the overlapped region. A quantity of the first elastomers 10 is greater than that of the second elastomer 14.

Certainly, in addition to elastomers, another electrical connector, for example, conductive silica gel or conductive foam, may be used to implement connection between the primary circuit board 7 and each of the first secondary circuit board 8 and the second secondary circuit board 13. The first secondary circuit board 8 may be electrically connected to the primary circuit board 7 by using first conductive silica gel or first conductive foam, and the second secondary circuit board 13 may be electrically connected to the primary circuit board 7 by using second conductive silica gel or second conductive foam. The first conductive silica gel or the first conductive foam has an operating height different from that of the second conductive silica gel or the second conductive foam. In addition, different types of electrical connectors may be used in combination. For example, the first secondary circuit board 8 is electrically connected to the primary circuit board 7 by using the first elastomers 10, the second secondary circuit board 13 is electrically connected to the primary circuit board 7 by using the second conductive silica gel, and so on.

To position the first secondary circuit board 8 and the second secondary circuit board 13, the bearing surface of the positioning frame 5 is provided with a positioning column 16 perpendicular to the first secondary circuit board 8 and the second secondary circuit board 13. The first secondary circuit board 8 is provided with a positioning hole 17 for the positioning column 16 to pass through. The second secondary circuit board 13 is provided with a positioning groove 18 for the positioning column 16 to pass through. A cross section of the positioning column 16 is circular (or polygonal). The positioning hole 16 is a circular hole, and the positioning groove 18 is a semi-circular groove, which are respectively located at upper and lower layers to coordinate with the positioning column 16. The positioning column 16 can limit degrees of freedom of the first secondary circuit board 8 and the second secondary circuit board 13 in deviating from planes on which the circuit boards are located, so that the first secondary circuit board 8 and the second secondary circuit board 10 can be reliably positioned.

An inner wall of the positioning frame 5 is further provided with a positioning rib 19 protruding towards the inside of the positioning frame. A first right-angle portion 20 is formed on a side wall of the first secondary circuit board 8. A second right-angle portion 21 is formed on a side wall of the second secondary circuit board 13. The first right-angle portion 20 is disposed opposite to the second right-angle portion 21. The first right-angle portion 20 abuts against a side wall of the positioning rib 19 from one side, and the second right-angle portion 21 abuts against a side wall of the positioning rib 19 from the other side. In other words, in the overlapping direction, projections of the first right-angle portion 20 and the second right-angle portion 21 form a U-shaped groove. The U-shaped groove coincides with a projection of the positioning rib 19, thereby implementing an abutting limitation. Through coordination between the positioning rib 19 and each of the first right-angle portion 20 and the second right-angle portion 21, the degrees of freedom of the first secondary circuit board 8 and the second secondary circuit board 13 in deviating from the planes on which the circuit boards are respectively located can be limited, so that the first secondary circuit board 8 and the second secondary circuit board 13 are more reliably positioned.

The positioning column 16 and the positioning rib 19 not only can effectively position the first secondary circuit board 8 and the second secondary circuit board 13 to prevent them from deviating from designed locations due to vibration, fall-off, or another cause during use, but also can help stack the first secondary circuit board 8 and the second secondary circuit board 13, thereby improving assembly efficiency. In addition, the first secondary circuit board 8 and the second secondary circuit board 13 share the same positioning column 16 and positioning rib 19 for positioning. This can avoid designing positioning columns and positioning ribs respectively for the first secondary circuit board 8 and the second secondary circuit board 13, thereby reducing quantities of the positioning columns 16 and the positioning ribs 19 and further simplifying the structure.

The foregoing embodiment is merely an example solution of this application, and a specific embodiment is not limited thereto. On this basis, targeted adjustments may be made according to actual needs, to obtain different implementations.

For example, one first secondary circuit board 8 may overlap two second secondary circuit boards 13.

In another embodiment, a periphery of the optical proximity-ambient light integrated sensor 4 is further provided with a speaker. The speaker is also provided with a second secondary circuit board 13, and is electrically connected to the primary circuit board 7 by using the second secondary circuit board 13. In this case, if dimensions of a first secondary circuit board 8 of the optical proximity-ambient light integrated sensor 4 permit, second secondary circuit boards 13 of both the vibration motor 3 and the speaker can overlap the first secondary circuit board 8 by using the foregoing structure, and then be connected to the primary circuit board 7.

In still another embodiment, a periphery of the optical proximity-ambient light integrated sensor 4 is further provided with a camera. The camera is also provided with a second secondary circuit board 13, and is electrically connected to the primary circuit board 7 by using the second secondary circuit board 13. In this case, if dimensions of a first secondary circuit board 8 of the optical proximity-ambient light integrated sensor 4 permit, second secondary circuit boards 13 of both the vibration motor 3 and the camera can overlap the first secondary circuit board 8 by using the foregoing structure, and then be connected to the primary circuit board 7.

By analogy, one first secondary circuit board 8 may further overlap more than two second secondary circuit boards 13. Examples are not enumerated herein.

In another embodiment, one end of the second secondary circuit board 13 that is connected to the primary circuit board 7 may partially overlap the first secondary circuit board 8. Alternatively, the first secondary circuit board 8 and the second secondary circuit board 13 are positioned by using two positioning columns 16. Alternatively, the positioning groove 18 on the second secondary circuit board 13 may also be designed in the form of a positioning hole or the like.

In addition, the second secondary circuit board 13 is not limited to a flexible circuit board, and may alternatively be a rigid circuit board or a flexible-rigid combined circuit board.

Certainly, in addition to a circuit board of the optical proximity-ambient light integrated sensor 4, a circuit board of a simple optical proximity sensor or a simple ambient light sensor or another electronic component may also serve as the first secondary circuit board 8 serving as an overlapping basis, to overlap a second secondary circuit board 13 of a peripheral electronic component.

In this embodiment, the primary circuit board refers to an integrated circuit board provided with electronic elements such as a processing chip, and the secondary circuit board refers to a circuit board connected to another constituent part of the primary circuit board. After the another constituent part is connected to the primary circuit board by using the secondary circuit board, the primary circuit board is used as a bridge for coordinated operation. However, in another embodiment, the locations of the primary circuit board and the secondary circuit board may be exchanged with each other.

In addition to the foregoing electronic assembly, an embodiment of this application further provides an electronic device, which may be specifically a mobile phone (as shown in FIG. 8), a tablet computer, a wearable device, a vehicle-mounted device, an augmented reality (augmented reality, AR) device/a virtual reality (virtual reality, VR) device, a notebook computer, an ultra-mobile personal computer (ultra-mobile personal computer, UMPC), a netbook, a personal digital assistant (personal digital assistant, PDA), or the like. The electronic device includes a housing 1 and an electronic assembly disposed inside the housing 1. The electronic assembly has the connection structure of the electronic assembly described above. For a rest structure of the electronic device, refer to a conventional technology. Details are not described herein.

The foregoing describes in detail the electronic assembly and the electronic device provided in the embodiments of this application. In this specification, principles and implementations of this application are described by using specific examples. The descriptions of the foregoing embodiments are merely intended to help understand the core idea of this application. It should be noted that, a person of ordinary skill in the art can further make some improvements and modifications to this application without departing from the principles of this application, and the improvements and modifications shall fall within the protection scope of the claims of this application.

What is claimed is:

1. An electronic assembly, comprising:
    a first electronic component with a first secondary circuit board;
    a second electronic component with a second secondary circuit board; and
    a primary circuit board;
    wherein the first secondary circuit board is electrically connected to the primary circuit board by a first electrical connector, interlayer space capable of accommodating the second secondary circuit board is formed between the first secondary circuit board and the primary circuit board, a portion of the second secondary circuit board that enters the interlayer space overlaps the first secondary circuit board and is electrically connected to the primary circuit board with a second electrical connector, and in an overlapping direction, the second secondary circuit board is located between the first secondary circuit board and the primary circuit board, the first electrical connector is located between the first secondary circuit board and the primary circuit board, and the second electrical connector is located between the second secondary circuit board and the primary circuit board; and wherein an operating height of the first electrical connector is greater than an operating height of the second electrical connector; and wherein the electronic assembly further comprises:
    a positioning mechanism configured to position the first secondary circuit board and the second secondary circuit board, wherein the positioning mechanism comprises at least one positioning column perpendicular to the first secondary circuit board and the second secondary circuit board, and the first secondary circuit board is provided with a first positioning hole or a first positioning groove for the positioning column to pass through, and the second secondary circuit board is provided with a second positioning hole or a second positioning groove for the positioning column to pass through.

2. The electronic assembly of claim 1, wherein an adhesive layer is provided in regions that overlap each other between the second secondary circuit board and the first secondary circuit board.

3. The electronic assembly of claim 1, wherein a cross section of the positioning column is circular or polygonal, and the first positioning hole or the first positioning groove and the second positioning hole or the second positioning groove have a shape capable of fitting in with the positioning column.

4. The electronic assembly of claim 1, wherein the second secondary circuit board is a flexible circuit board.

5. The electronic assembly of claim 1, wherein the first electronic component comprises an optical proximity sensor, an ambient light sensor, or an optical proximity-ambient light integrated sensor, and the second electronic component comprises one, two, or three of a camera, a speaker, and a vibration motor.

6. The electronic assembly of claim 1, wherein a difference between the operating height of the first electrical connector and the operating height of the second electrical connector is equal to a distance from one side of the first secondary circuit board that faces the primary circuit board to one side of the second secondary circuit board that faces the primary circuit board.

7. The electronic assembly of claim 6, wherein the second secondary circuit board overlaps a local region of the first secondary circuit board, and a single-layer non-overlapped region and a dual-layer overlapped region are formed after the overlapping of the two secondary circuit boards; and the first electrical connector is distributed along an edge of the non-overlapped region, and the second electrical connector is distributed along an edge of the overlapped region.

8. The electronic assembly of claim 7, wherein the first electrical connector is a first elastomer, first conductive silica gel, or first conductive foam; and the second electrical connector is a second elastomer, second conductive silica gel, or second conductive foam.

9. The electronic assembly of claim 1, wherein the positioning mechanism comprises a positioning frame configured to bear the first secondary circuit board, and an inner wall of the positioning frame is provided with a positioning rib protruding towards the inside of the positioning frame, to position the first secondary circuit board and the second secondary circuit board.

10. The electronic assembly of claim 9, wherein a glue layer is provided between the first secondary circuit board and a bearing surface of the positioning frame.

11. The electronic assembly of claim 9, wherein the first secondary circuit board is provided with a first abutting portion, the second secondary circuit board is provided with a second abutting portion, and both the first abutting portion and the second abutting portion abut against the positioning rib.

12. The electronic assembly of claim 11, wherein the first abutting portion comprises a first right-angle portion formed on a side wall of the first secondary circuit board, the second abutting portion comprises a second right-angle portion formed on a side wall of the second secondary circuit board, the first right-angle portion is disposed opposite to the second right-angle portion, and the first right-angle portion and the second right-angle portion each abut against a side wall of the positioning rib.

13. An electronic device, comprising:
a housing; and
an electronic assembly disposed inside the housing;
wherein the electronic assembly comprises:
    a first electronic component with a first secondary circuit board;
    a second electronic component with a second secondary circuit board; and
    a primary circuit board;
wherein the first secondary circuit board is electrically connected to the primary circuit board by a first electrical connector, interlayer space capable of accommodating the second secondary circuit board is formed between the first secondary circuit board and the primary circuit board, a portion of the second secondary circuit board that enters the interlayer space overlaps the first secondary circuit board and is electrically connected to the primary circuit board with a second electrical connector, and in an overlapping direction, the second secondary circuit board is located between the first secondary circuit board and the primary circuit board, the first electrical connector is located between the first secondary circuit board and the primary circuit board, and the second electrical connector is located between the second secondary circuit board and the primary circuit board;

wherein an operating height of the first electrical connector is greater than an operating height of the second electrical connector; and wherein the electronic assembly further comprises:
    a positioning mechanism configured to position the first secondary circuit board and the second secondary circuit board, wherein the positioning mechanism comprises at least one positioning column perpendicular to the first secondary circuit board and the second secondary circuit board, and the first secondary circuit board is provided with a first positioning hole or a first positioning groove for the positioning column to pass through, and the second secondary circuit board is provided with a second positioning hole or a second positioning groove for the positioning column to pass through.

14. The electronic device of claim 13, wherein a cross section of the positioning column is circular or polygonal, and the first positioning hole or the first positioning groove and the second positioning hole or the second positioning groove have a shape capable of fitting in with the positioning column.

15. The electronic device of claim 13, wherein an adhesive layer is provided in regions that overlap each other between the second secondary circuit board and the first secondary circuit board.

16. The electronic device of claim 13, wherein the positioning mechanism comprises a positioning frame configured to bear the first secondary circuit board, and an inner wall of the positioning frame is provided with a positioning rib protruding towards the inside of the positioning frame, to position the first secondary circuit board and the second secondary circuit board.

17. The electronic device of claim 16, wherein the first secondary circuit board is provided with a first abutting portion, the second secondary circuit board is provided with a second abutting portion, and both the first abutting portion and the second abutting portion abut against the positioning rib.

18. The electronic device of claim 13, wherein a difference between the operating height of the first electrical connector and the operating height of the second electrical connector is equal to a distance from one side of the first secondary circuit board that faces the primary circuit board to one side of the second secondary circuit board that faces the primary circuit board.

19. The electronic device of claim 18, wherein the second secondary circuit board overlaps a local region of the first secondary circuit board, and a single-layer non-overlapped region and a dual-layer overlapped region are formed after the overlapping of the two secondary circuit boards; and the first electrical connector is distributed along an edge of the non-overlapped region, and the second electrical connector is distributed along an edge of the overlapped region.

20. The electronic device of claim 19, wherein the first electrical connector is a first elastomer, first conductive silica gel, or first conductive foam; and the second electrical connector is a second elastomer, second conductive silica gel, or second conductive foam.

* * * * *